United States Patent
Yeh et al.

(10) Patent No.: US 9,443,743 B1
(45) Date of Patent: Sep. 13, 2016

(54) METHOD FOR DIRECTLY ATTACHING DIELECTRIC TO CIRCUIT BOARD WITH EMBEDDED ELECTRONIC DEVICES

(71) Applicant: UNITECH PRINTED CIRCUIT BOARD CORP., New Taipei (TW)

(72) Inventors: Ming Yi Yeh, New Taipei (TW); Shun Yueh Hsu, New Taipei (TW); Kun Chi Chen, New Taipei (TW); Hung Min Chen, New Taipei (TW)

(73) Assignee: UNITECH PRINTED CIRCUIT BOARD CORP., New Taipei (TW)

( * ) Notice: Subject to any disclaimer, the term of this patent is extended or adjusted under 35 U.S.C. 154(b) by 0 days.

(21) Appl. No.: 14/735,871

(22) Filed: Jun. 10, 2015

(30) Foreign Application Priority Data

Apr. 13, 2015 (TW) .............................. 104111751 A

(51) Int. Cl.
| | |
|---|---|
| *H01L 21/00* | (2006.01) |
| *H01L 21/48* | (2006.01) |
| *H01L 33/48* | (2010.01) |
| *H01L 33/62* | (2010.01) |
| *H01L 33/52* | (2010.01) |

(52) U.S. Cl.
CPC ......... *H01L 21/486* (2013.01); *H01L 21/4857* (2013.01); *H01L 33/486* (2013.01); *H01L 33/52* (2013.01); *H01L 33/62* (2013.01); *H01L 2933/005* (2013.01); *H01L 2933/0066* (2013.01)

(58) Field of Classification Search
CPC .... H05K 1/09; H05K 3/4644; H05K 3/0058; H05K 2201/0338; H05K 2201/0341; H05K 2201/0394; H05K 2201/09036; H05K 2201/09518
USPC ....................................................... 438/25, 26
See application file for complete search history.

(56) References Cited

U.S. PATENT DOCUMENTS

| | | | |
|---|---|---|---|
| 2002/0182374 A1 | 12/2002 | Tung | |
| 2014/0001583 A1* | 1/2014 | Teh ........................ | B81B 3/0005 257/417 |
| 2014/0060896 A1* | 3/2014 | Shin ........................ | H05K 1/09 174/252 |

FOREIGN PATENT DOCUMENTS

TW 518616 B 1/2003

* cited by examiner

*Primary Examiner* — Brook Kebede
(74) *Attorney, Agent, or Firm* — Muncy, Geissler, Olds & Lowe, P.C.

(57) ABSTRACT

A method for directly attaching dielectric to a circuit board with embedded electronic devices is provided. That is, a plurality of through holes are produced before embedding an electronic device, wherein plural through holes are corresponding to a plurality of electrodes of the electronic device. So that the plural electrodes of the electronic device is accurately positioned with the through holes if the electronic device is being embedded. On the other hand, since the first dielectric layer is adhesive, the electronic device is directly stuck on the first dielectric layer in order to save cost of adhesive material or metal conductive paste in prior arts.

10 Claims, 6 Drawing Sheets

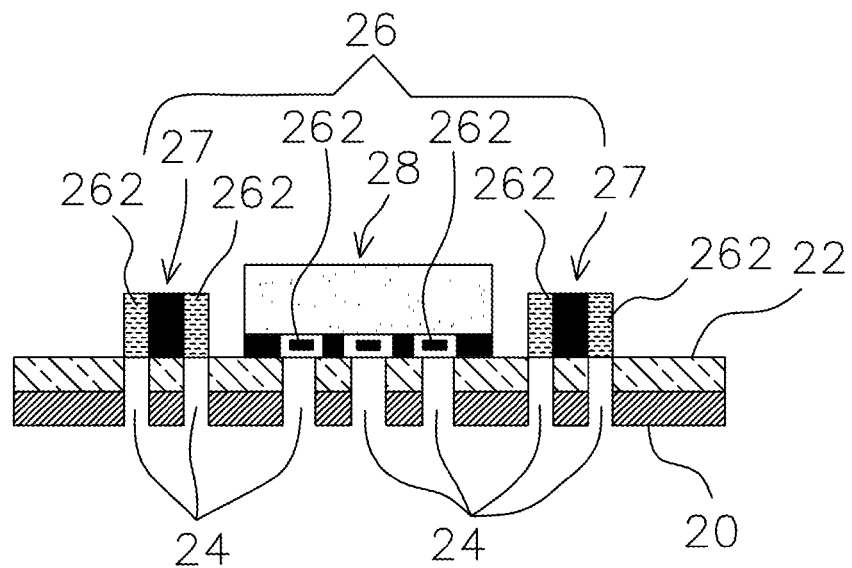
FIG. 3A
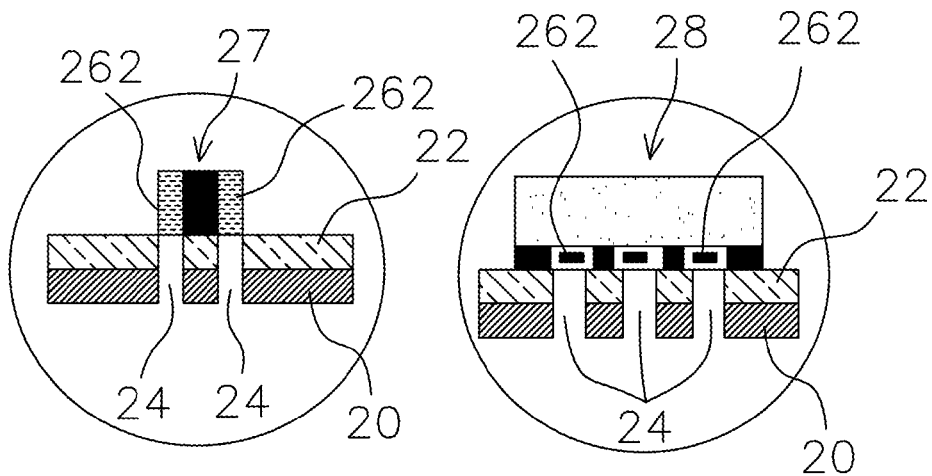
FIG. 3B
FIG. 3C

METHOD FOR DIRECTLY ATTACHING DIELECTRIC TO CIRCUIT BOARD WITH EMBEDDED ELECTRONIC DEVICES

BACKGROUND OF THE INVENTION

1. Field of the Invention

The present invention generally relates to a method for manufacturing a PCB, more particularly to a method for directly attaching dielectric to a circuit board with embedded electronic devices.

2. Description of the Prior Art

Fast and high-density, the two requirements have been the driving forces in the field of high-tech development. Those purposes are to reduce production costs and to meet consumer demand. Therefore, nowadays, electronics and mobile communications products are continuously approaching slim volume, versatility, high reliability and cost reduction with a generation rate of three to five years. Accordingly, for the IC design of electronic products, electronic components occupying largest areas are undertaking an integration of the revolution.

In the field of PCB, area occupied by electronic components is always a restriction for approaching slim volume, and there is one more important issue that excessive welding points cause lower reliability and increasing cost. Hence, in order to approach the tendencies of smaller slim volume, more versatility, higher reliability, more cost reduction, and more room, to consolidate and embed electronic components has become an important issue in the related fields.

To solve aforementioned problems, a patent, No. 518616 and titled a method for manufacturing a multi-layer PCB with embedded passive components, of Republic of China disclosed a technology that a plurality of film electronic components are integrated into a multi-layer PCB. But, there are several key points should be re-considered and are briefly described below. The first point is the manufacturing ability to embed thick film or thin film electronic components into a PCB. The second point is how the accuracy be kept after integration. The third point is how to reduce the differential value between an integration value and a default value to a threshold limit value. Further, adhesive material or metal conductive paste may be applied to those electronic components in order to stick electronic components onto a dielectric layer, and it causes higher manufacturing cost. As a matter of fact, the technology taught by the patent still has some shortcomings.

Accordingly, the inventor has started to develop a method for manufacturing a PCB with embedded electronic components, and the method is able to improve accuracy, efficiency and stability.

SUMMARY OF THE INVENTION

The inventor has studied related technologies to develop a method for directly attaching dielectric to a circuit board with embedded electronic devices according to shortcomings in prior arts.

The main objective of the present invention is to provide a method for directly attaching dielectric to a circuit board with embedded electronic devices. That is, a plurality of through holes are produced before embedding an electronic device, wherein plural through holes are corresponding to a plurality of electrodes of the electronic device. So that the plural electrodes of the electronic device is accurately positioned with the through holes if the electronic device is being embedded. On the other hand, since the first dielectric layer is adhesive, the electronic device is directly stuck on the first dielectric layer in order to save cost of adhesive material or metal conductive paste in prior arts.

The method for directly attaching dielectric to a circuit board with embedded electronic devices comprises the steps of: providing a copper clad laminate that comprises a copper layer; attaching a first dielectric layer to the copper clad laminate, wherein the first dielectric layer is adhesive; producing a plurality of through holes in the first dielectric layer and the copper clad laminate, the through holes being corresponding to the plural electrodes of at least one electronic device, wherein the electronic device pre-sets in the first dielectric layer; disposing the at least one electronic device on the first dielectric layer, so that the plural electrodes of the electronic device are corresponding to the through holes; continuously disposing a circuit substrate that accommodates a slot of the electronic device at two sides of the electronic device, so as to let the electronic device be accommodated in the slot, the circuit substrate having a second dielectric layer, a second circuit layer and a third circuit layer, wherein the second circuit layer is beneath the second dielectric layer and the third circuit layer is above the second dielectric layer; and overlapping a third dielectric layer and an additional circuit layer on the electronic device and the circuit substrate, wherein the additional circuit layer is beyond the third dielectric layer, and then laminating the third dielectric layer and the additional circuit layer on the electronic device and the circuit substrate, wherein the third dielectric layer is with plasticity so as to fabricate a basic circuit board.

Accordingly, the copper clad laminate has a first circuit layer beyond.

Accordingly, the copper clad laminate further comprises the group consisting of polyamide of a substrate and glass fiber film of a substrate, the copper clad laminate attaches to the substrate.

Accordingly, the first dielectric layer, the second dielectric layer and the third dielectric layer are selected from the group consisting of a polyester film (Prepreg) with a high resin content, a dielectric film, and the combination of the polyester film and the dielectric film.

Accordingly, the first dielectric layer, the second dielectric layer or the third dielectric layer is fabricated by plural layers.

Accordingly, the through holes are processed by the procedures of coppering and electroplating, a penetrated hole is through via mechanical drilling and is processed by the procedures of coppering and electroplating, after the additional circuit layer is laminated on the basic circuit board and the third dielectric layer is laminated on the electronic device and the circuit substrate.

Accordingly, the additional circuit layer, the first circuit layer, the second circuit layer, and the third circuit layer are built for circuits via film, exposure, development, etching, after the through holes are processed by the procedures of coppering and electroplating, the penetrated hole is through via mechanical drilling and is processed by the procedures of coppering and electroplating.

Accordingly, the electronic device is selected from the group consisting of: an active electronic device, a passive electronic device and a light emitting element.

Accordingly, the electronic device is the light emitting element, and the light emitting element is an LED.

Accordingly, the additional circuit layer has an opening corresponding to the light emitting element so as to let the light emitting element be exposed without shielding while adding the additional circuit layer on the basic circuit board.

BRIEF DESCRIPTION OF THE DRAWINGS

The objects, spirits, and advantages of the preferred embodiments of the present invention will be readily understood by the accompanying drawings and detailed descriptions, wherein:

FIG. 3A to FIG. 3C illustrate a third step of the main embodiment of the present invention;

DETAILED DESCRIPTION OF THE INVENTION

Following preferred embodiments and figures will be described in detail so as to achieve aforesaid objects.

Figure 1:
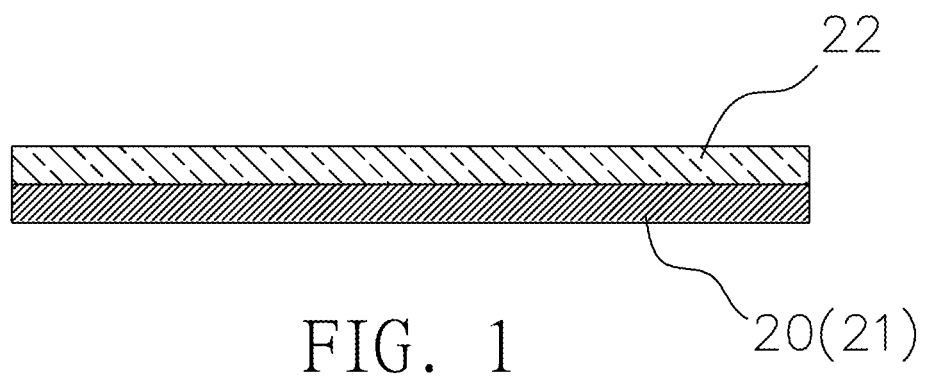
FIG. 1 illustrates a first step of a main embodiment of the present invention.
Figure 2:
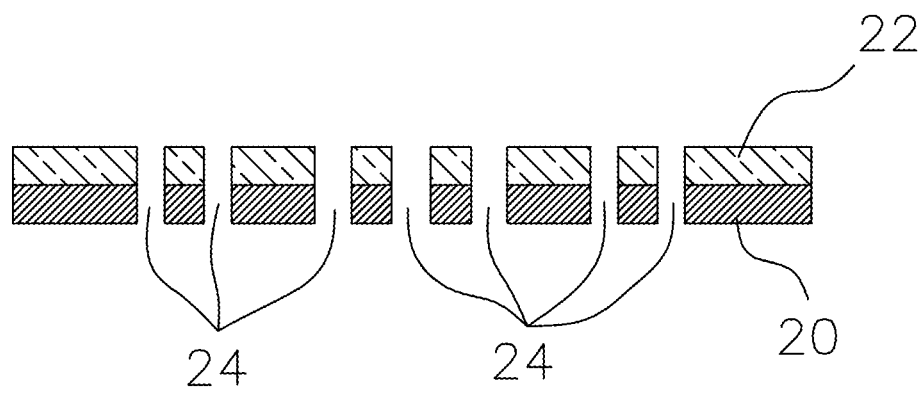
FIG. 2 illustrates a second step of the main embodiment of the present invention.
Figure 4A:
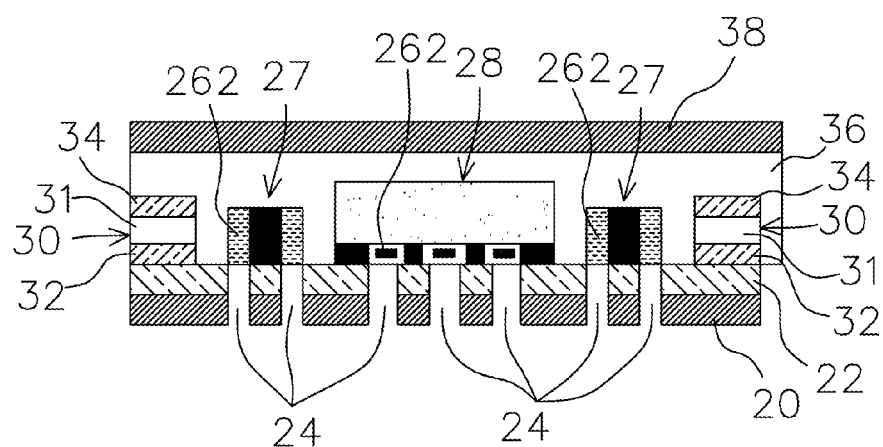
FIG. 4A illustrates a fourth step of the main embodiment of the present invention.
Figure 4B:
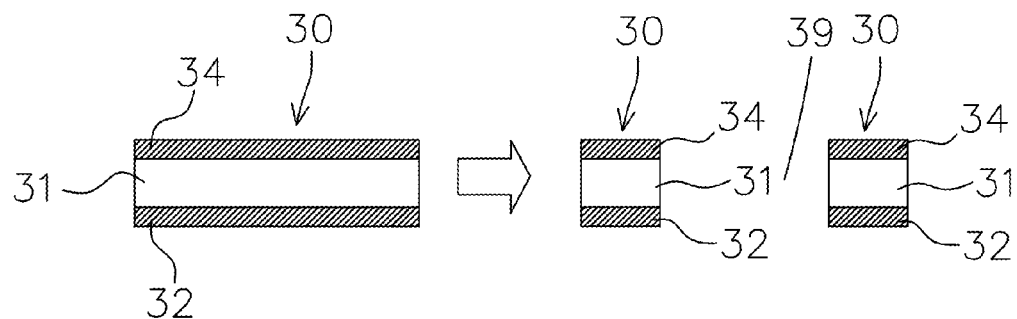
FIG. 4B illustrates a pre-machining view of a circuit substrate of the present invention.
Figure 5:
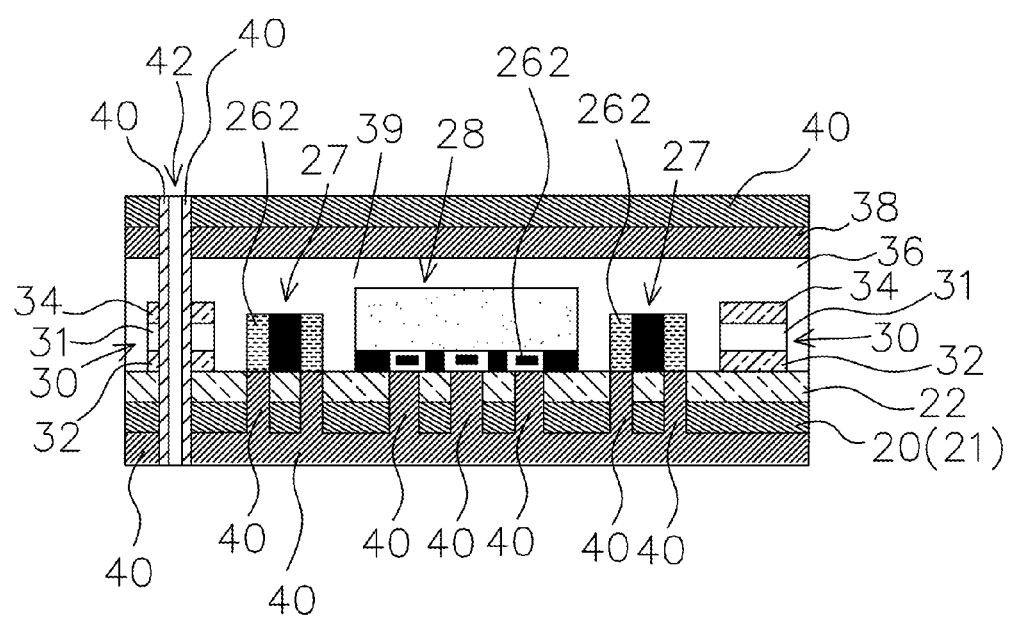
FIG. 5 illustrates a fifth step of the main embodiment of the present invention.
Figure 6:
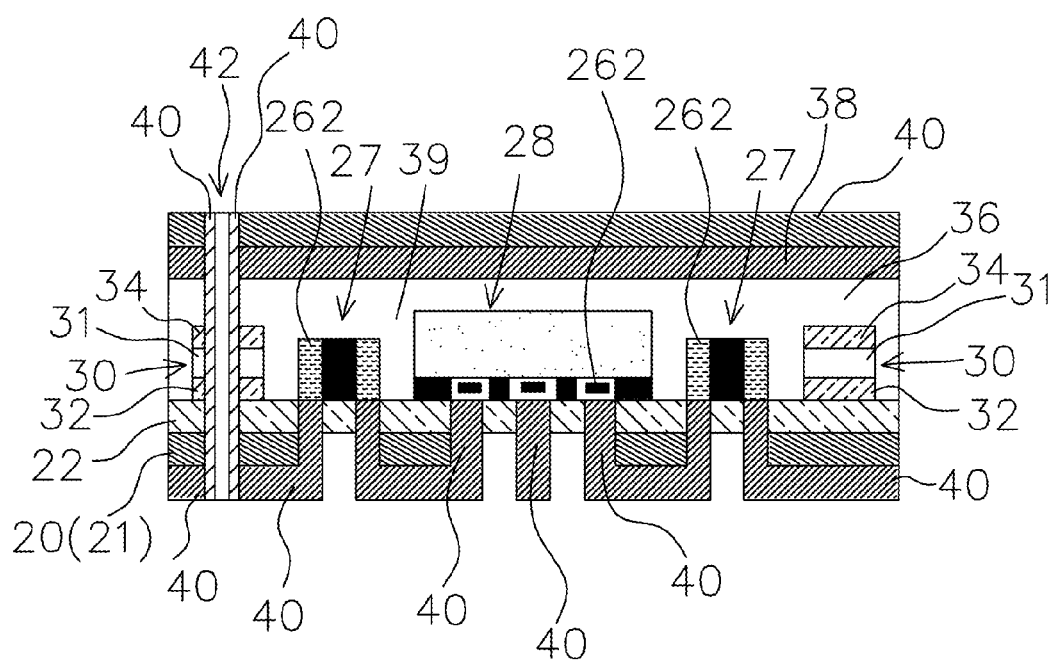
FIG. 6 illustrates a sixth step of the main embodiment of the present invention.

Please refer to FIG. 1 to FIG. 6, which disclose a method for directly attaching dielectric to a circuit board with embedded electronic devices, and the method comprises the steps of:

providing a copper clad laminate 20 that comprises a copper layer, as shown in FIG. 1; attaching a first dielectric layer 22 to the copper clad laminate 20, wherein the first dielectric layer 22 is adhesive; wherein the copper clad laminate 20 has a first circuit layer 21 beyond, the first circuit layer 21 is built for circuits via film, exposure, development, etching;

producing a plurality of through holes 24 in the first dielectric layer 22 and the copper clad laminate 20, as shown in FIG. 2, the through holes 24 being corresponding to the plural electrodes 262 of at least one electronic device 26 as shown in FIG. 3A, wherein the electronic device 26 pre-sets in the first dielectric layer 22; according to the locations of the through holes 24, continuously disposing the at least one electronic device 26 on the first dielectric layer 22, so that the plural electrodes 262 of the electronic device 26 are corresponding to the through holes 24, as shown in FIG. 3A; wherein the electronic device 26 can be an active electronic device 28 as chip, a passive electronic device 27 as resistor, capacitor, inductor, a light emitting element 29 as LED, or the combination of the aforementioned, but the type and number of the electronic device 26 are not limited thereto; as the present embodiment, it is a combination of one active electronic device 28 and two passive electronic device 27, and it would be obvious that the electrodes 262 of the electronic device 26 are precisely corresponding to the through holes 24, so that signal transmission among the electrodes 262 and the first circuit layer 21 is very accurate; as shown in FIG. 3B and FIG. 3C, which are a state that the electronic device 26 plays as the passive electronic device 27 and another state that the electronic device 26 plays as the active electronic device 28;

continuously disposing a circuit substrate 30 that accommodates a slot 39 of the electronic device 26 at two sides of the electronic device 26, so as to let the electronic device 26 be accommodated in the slot 39, the circuit substrate 30 having a second dielectric layer 31, a second circuit layer 32 and a third circuit layer 34, wherein the second circuit layer 32 is beneath the second dielectric layer 31 and the third circuit layer 34 is above the second dielectric layer 31, as shown in FIG. 4A; wherein the circuit substrate 30 is pre-machined in order to accommodate the slot 39 of the electronic device 26, and is disposed at the two sides of the electronic device 26, further that the pre-machining is pre-set and not included in the manufacturing of circuit board, and it is a parallel manufacturing procedure as tool machining according to precision, for example CNC, die or laser cutting tools, in order to reduce production costs and increase productivity;

overlapping a third dielectric layer 36 and an additional circuit layer 38 on the electronic device 26 and the circuit substrate 30, wherein the additional circuit layer 38 is beyond the third dielectric layer 36, as shown in FIG. 4A, and then laminating the third dielectric layer 36 and the additional circuit layer 38 on the electronic device 26 and the circuit substrate 30, wherein the third dielectric layer 36 is with plasticity so as to fabricate a basic circuit board;

metalizing the electronic device 26 and external circuits for conduction, so that the through holes 24 are processed by the procedures of coppering and electroplating, a penetrated hole 42 being through via mechanical drilling and being processed by the procedures of coppering and electroplating, so as to conduct the electronic device 26 and the basic circuit board, and therefore the additional circuit layer 38, the first circuit layer 21, the second circuit layer 32, and the third circuit layer 34 are conducted with the electronic device 26 for increasing a plating layer 40 to conduct signals, as shown in FIG. 5;

the additional circuit layer 38, the first circuit layer 21, the second circuit layer 32, and the third circuit layer 34 are continuously built for circuits via film, exposure, development, etching, etc., as shown in FIG. 6.

Figure 7:
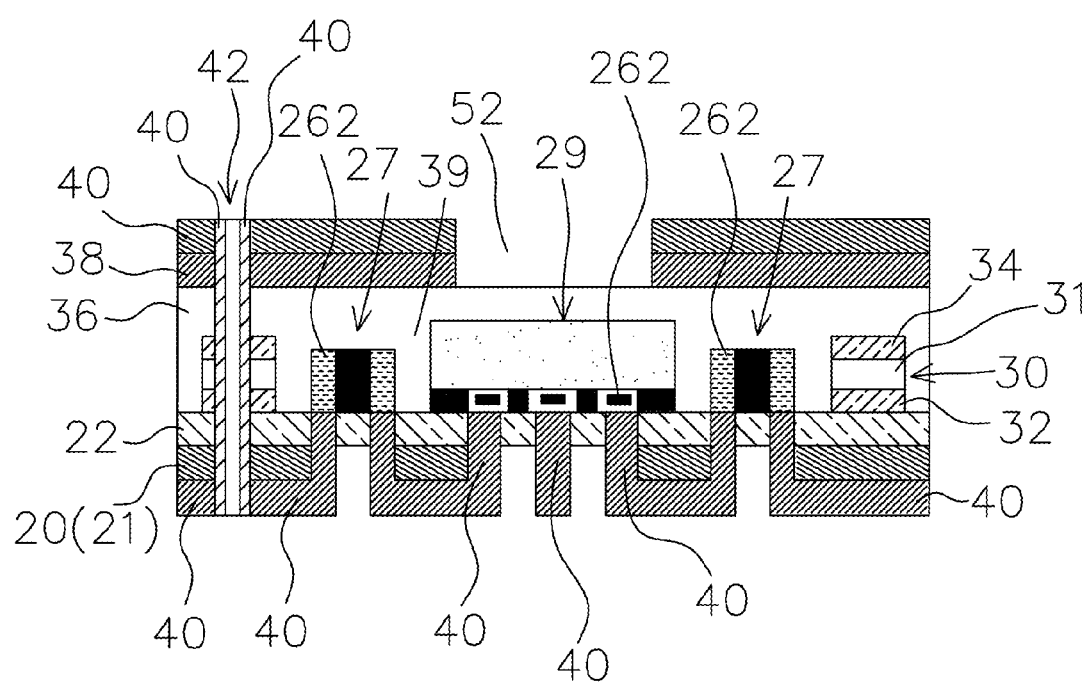
FIG. 7 illustrates a schematic view of another embodiment of the present invention.

As shown in FIG. 7, if the electronic device 26 is the light emitting element 29, and the light emitting element 29 is an LED, it is different than the passive electronic device and the active electronic device in the range of manufacturing. The difference is that the additional circuit layer 38 has an opening 52 corresponding to the light emitting element 29 so as to let the light emitting element 29 be exposed without shielding while adding the additional circuit layer 38 on the basic circuit board.

For the method for directly attaching dielectric to a circuit board with embedded electronic devices, the first dielectric layer 22, the second dielectric layer 31 and the third dielectric layer 36 are shaped as flake for the present embodiment, or the circuit board is fabricated by single layer or overlapped by plural layers. The first dielectric layer 22, the second dielectric layer 31 and the third dielectric layer 36 are the materials with plasticity and selected from the group consisting of a polyester film (Prepreg) with a high resin content, a dielectric film, and the combination of the polyester film and the dielectric film. So that, because of the plasticity of the third dielectric layer 36, the third dielectric layer 36 can fill with gap between the electronic device 26 and the circuit substrate 30 in order to enhance fixing strength for the electronic device 26. Similarly, the additional circuit layer 38 is able to increase a buffering force while being compressed, and avoids that the embedded electronic device 26 is damaged by gravity.

The method for directly attaching dielectric to a circuit board with embedded electronic devices is briefly described as following. The plurality of through holes 24 are produced before embedding the electronic device 26, wherein the through holes 24 are corresponding to the plural electrodes 262 of the electronic device 26. So that the plural electrodes 262 of the electronic device 26 is accurately positioned with the through holes 24 if the electronic device 26 is being embedded. On the other hand, since the first dielectric layer 22 is adhesive, the electronic device 26 is directly stuck on the first dielectric layer 22 in order to save cost of adhesive material or metal conductive paste in prior arts. As it can be seen, the present invention is valuable in business and is to improve from prior arts for more efficient. So that the present invention fully meets the requirements of a patent.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for directly attaching dielectric to a circuit board with embedded electronic devices, comprising the steps of:
   providing a copper clad laminate that comprises a copper layer;
   attaching a first dielectric layer to the copper clad laminate, wherein the first dielectric layer is adhesive;
   producing a plurality of through holes in the first dielectric layer and the copper clad laminate, the through holes corresponding to plural electrodes of at least one electronic device, wherein the electronic device presets in the first dielectric layer;
   disposing the at least one electronic device on the first dielectric layer, so that the plural electrodes of the electronic device correspond to the through holes;
   continuously disposing a circuit substrate that accommodates a slot of the electronic device at two sides of the electronic device, so as to let the electronic device be accommodated in the slot, the circuit substrate having a second dielectric layer, a second circuit layer and a third circuit layer, wherein the second circuit layer is beneath the second dielectric layer and the third circuit layer is above the second dielectric layer; and
   overlapping a third dielectric layer and an additional circuit layer on the electronic device and the circuit substrate, wherein the additional circuit layer is beyond the third dielectric layer, and then laminating the third dielectric layer and the additional circuit layer on the electronic device and the circuit substrate, wherein the third dielectric layer has plasticity so as to fabricate a basic circuit board.

2. The method for directly attaching dielectric to a circuit board with embedded electronic devices according to claim 1, wherein the copper clad laminate has a first circuit layer.

3. The method for directly attaching dielectric to a circuit board with embedded electronic devices according to claim 2, wherein the through holes are processed by the procedures of coppering and electroplating, a penetrated hole being through via mechanical drilling and being processed by the procedures of coppering and electroplating, after the additional circuit layer is laminated on the basic circuit board and the third dielectric layer is laminated on the electronic device and the circuit substrate.

4. The method for directly attaching dielectric to a circuit board with embedded electronic devices according to claim 3, wherein the additional circuit layer, the first circuit layer, the second circuit layer, and the third circuit layer are built for circuits via film, exposure, development, etching, after the through holes are processed by the procedures of coppering and electroplating, the penetrated hole is through via mechanical drilling and is processed by the procedures of coppering and electroplating.

5. The method for directly attaching dielectric to a circuit board with embedded electronic devices according to claim 1, wherein the copper clad laminate further comprises the group consisting of polyamide of a substrate and glass fiber film of a substrate, the copper clad laminate attaching to the substrate.

6. The method for directly attaching dielectric to a circuit board with embedded electronic devices according to claim 1, wherein the first dielectric layer, the second dielectric layer and the third dielectric layer are selected from the group consisting of a polyester film (Prepreg) with a high resin content, a dielectric film, and the combination of the polyester film and the dielectric film.

7. The method for directly attaching dielectric to a circuit board with embedded electronic devices according to claim 1, wherein the first dielectric layer, the second dielectric layer or the third dielectric layer is fabricated by plural layers.

8. The method for directly attaching dielectric to a circuit board with embedded electronic devices according to claim 1, the electronic device is selected from the group consisting of: an active electronic device, a passive electronic device and a light emitting element.

9. The method for directly attaching dielectric to a circuit board with embedded electronic devices according to claim 8, wherein the electronic device is the light emitting element, and the light emitting element is an LED.

10. The method for directly attaching dielectric to a circuit board with embedded electronic devices according to claim 9, wherein the additional circuit layer has an opening corresponding to the light emitting element so as to let the light emitting element be exposed without shielding while adding the additional circuit layer on the basic circuit board.

* * * * *